(12) United States Patent
Garza

(10) Patent No.: US 8,705,917 B2
(45) Date of Patent: Apr. 22, 2014

(54) SOLAR ENERGY DEVICE

(76) Inventor: Jorge A Garza, San Antonio, TX (US)

(*) Notice: Subject to any disclaimer, the term of this patent is extended or adjusted under 35 U.S.C. 154(b) by 533 days.

(21) Appl. No.: 12/840,946

(22) Filed: Jul. 21, 2010

(65) Prior Publication Data

US 2012/0017888 A1    Jan. 26, 2012

(51) Int. Cl.
*G02B 5/10* (2006.01)
*G02B 7/198* (2006.01)
*G02B 17/00* (2006.01)
*H01L 31/052* (2014.01)
*F24J 2/52* (2006.01)
*B21B 31/02* (2006.01)

(52) U.S. Cl.
CPC .............. *H01L 31/052* (2013.01); *B21B 31/02* (2013.01); *F24J 2/5232* (2013.01)
USPC .............. 385/33; 359/619; 359/642; 359/853

(58) Field of Classification Search
CPC ........................................ F24J 2/5232
USPC ....................... 385/33; 359/619, 853
See application file for complete search history.

(56) References Cited

U.S. PATENT DOCUMENTS

| | | | |
|---|---|---|---|
| 2,022,144 A | 11/1935 | Nicolson | |
| 4,152,752 A | 5/1979 | Niemi | |
| 4,297,000 A | 10/1981 | Fries | |
| 4,425,905 A | 1/1984 | Mori | |
| 4,511,755 A | 4/1985 | Mori | |
| 4,565,185 A * | 1/1986 | Mori | 126/577 |
| 4,809,675 A | 3/1989 | Mori | |
| 4,943,141 A * | 7/1990 | Mori | 359/619 |
| 5,581,447 A * | 12/1996 | Raasakka | 362/557 |
| 6,113,255 A | 9/2000 | Shalit | |
| 6,381,070 B1 | 4/2002 | Cheng | |
| 7,231,128 B2 * | 6/2007 | Muhs et al. | 385/88 |
| 2006/0174867 A1* | 8/2006 | Schaafsma | 126/683 |
| 2008/0289688 A1* | 11/2008 | Hammerbacher et al. | 136/256 |
| 2009/0114210 A1* | 5/2009 | Guice et al. | 126/569 |
| 2009/0308377 A1 | 12/2009 | Kleinwaechter | |
| 2010/0108121 A1* | 5/2010 | Liu | 136/246 |
| 2010/0122721 A1* | 5/2010 | Liu | 136/246 |

FOREIGN PATENT DOCUMENTS

WO PCT/DE2007/001680    6/2009

OTHER PUBLICATIONS

The Physics Classroom: Image Formation by Lenses, webpage which does not indicate date of creation, available at www.physicsclassroom.com/Class/refrn/u14l5a.cfm.
J.B.Calvert, The Heiligenschein, webpage which indicates it was created on Aug. 4, 2003 and revised on Aug. 13, 2003, available at http://mysite.du.edu/~jcalvert/astro/helig.htm#Geom.
Curt Maxey, Hybrid Solar Lighting, Antick, Jun. 2008, available at http://www.photonics.com/Content/ReadArticle.aspx?ArticleID=33892.

* cited by examiner

*Primary Examiner* — Eric Wong
(74) *Attorney, Agent, or Firm* — Gunn, Lee & Cave, P.C.

(57) ABSTRACT

The present invention is a solar energy device that uses an improved light collector to collect sunlight. The improved light collector is a translucent, and preferably transparent, solid sphere. The light collector transmits sunlight that is incident thereon and emits the light to a focal point on the other side of the sphere. An energy-receiving medium is located at or near the focal point of the emitted light and absorbs energy from the emitted light. The energy-receiving medium uses the energy from the emitted light in accordance with the desired function of the present invention.

19 Claims, 5 Drawing Sheets

SOLAR ENERGY DEVICE

CROSS REFERENCES TO RELATED APPLICATIONS

None

STATEMENT REGARDING FEDERALLY SPONSORED RESEARCH OR DEVELOPMENT

Not applicable

BACKGROUND OF THE INVENTION

1. Technical Field

The present invention relates generally to an improved solar energy device. More specifically, the invention relates to a device that uses a number of solid, transparent spheres which collect sunlight that is incident thereon, transmit the sunlight through the spheres, and emit the sunlight toward a predetermined energy-receiving medium located on the side of the spheres facing away from the sun.

2. Description of the Related Art

Society's constantly increasing demand for energy is a global problem that plagues humankind. The growth of Earth's population and technological advancements requiring energy continually increase the global demand. The ever-increasing energy demand has lead to questions about whether the Earth's supply of fossil fuel energy resources can meet the needs of future populations and the search for alternative sources of energy has become vitally important.

The energy created by the sun is an alternative source of energy to fossil fuels. The sun provides energy through both heat and light. The sun supplies practically limitless energy, and, as such, solar energy may provide a solution to Earth's global energy demand, if harnessed effectively.

BRIEF SUMMARY OF THE INVENTION

The present invention is directed to a solar energy device with an improved light collector. It utilizes a translucent, and preferably transparent, sphere as a light collector to collect, transmit, and emit sunlight. The spherical light collector collects the sunlight that is incident thereon as the sunlight enters through a sun-facing side of the sphere and emits the light through the opposite side. The sphere is made from any solid material(s) that allow sunlight to be at least partially transmitted through the light collector and emitted from the side of the light collector which does not face the sun. In its preferred embodiment, the material(s) cause the emitted light to converge to a focal point, where the intensity of the emitted light is at its greatest.

An energy-receiving medium is located at or near the non-sun-facing side of the light collector, preferably at the focal point of the light emitted from the sphere. The energy-receiving medium receives and uses the emitted light according to the desired function of the present invention. In one embodiment the energy-receiving medium is a light-transmitting conduit such as a bundle of optical fibers and the emitted light travels from through the optical fibers to another location for illumination purposes. The energy-receiving medium in other embodiments may be a solar cell that uses heat and/or light from the emitted light to generate electricity or heat sink that absorbs heat from the emitted light for heating applications.

Preferably, the present invention has a plurality of spherical light collectors arranged into an array, with each of the light collectors within the array being coupled to a separate energy-receiving medium with a bracket. Each light collector/energy-receiving medium pair within a bracket is considered a light-collecting module. As such, the array of light collectors in the preferred embodiment is effectively an array of light-collecting modules. The array is pivotally mounted between two arms on a stand and can rotate about an axis through the middle of the array. Similarly, the preferred stand can also rotate about an axis that is transverse to the axis of rotation of the array. As such, the solar energy device can move about dual axes and follow the path of the sun in the sky throughout the day.

DETAILED DESCRIPTION OF THE INVENTION

Figure 1:
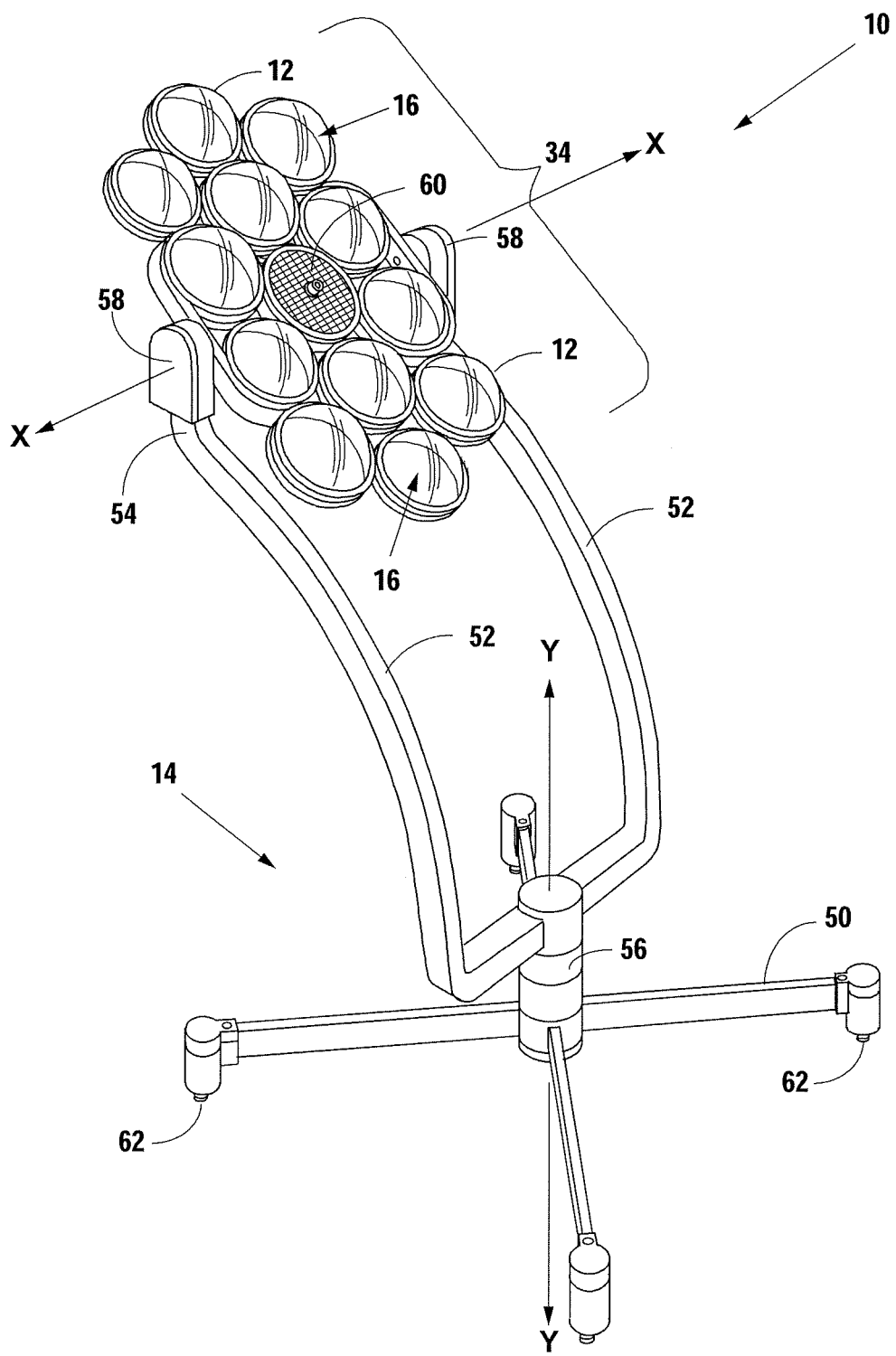
FIG. 1 illustrates a perspective view of a solar energy device incorporating the preferred embodiment of the present invention.
Figure 2:
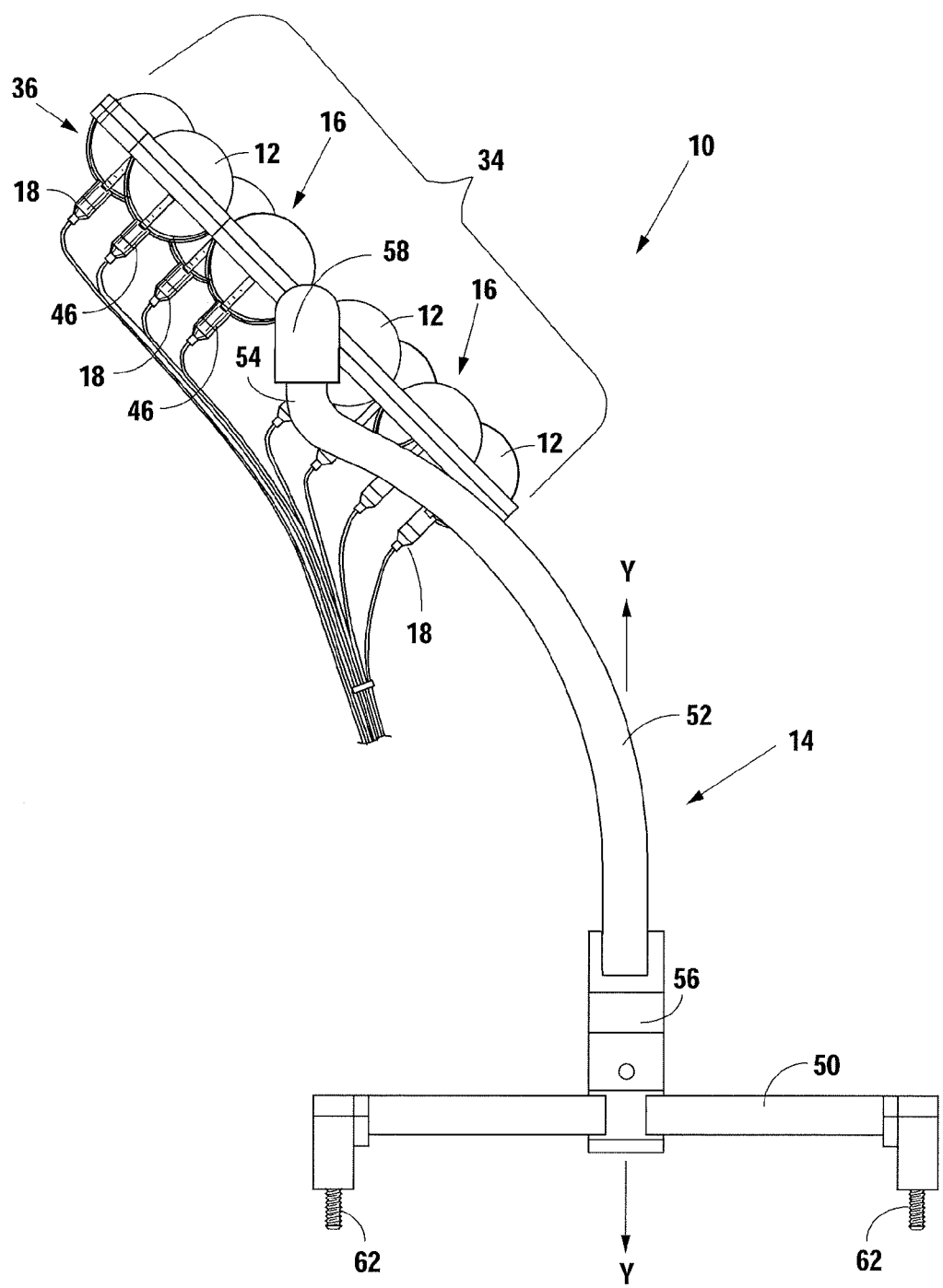
FIG. 2 shows a side view of the preferred embodiment of the solar energy device with a plurality of energy-receiving mediums extending therefrom.

Referring to FIGS. 1 & 2, the preferred embodiment of the present invention is shown. FIG. 1 shows a front perspective view of a solar energy device 10. The solar energy device 10 has at least one light collector 12 mounted to a stand 14 so that the light collector 12 has a sun-facing side 16 which faces the sun. As shown in FIG. 2, an energy-receiving medium 18 is located at or near the light collector 12, away from the sun-facing side 16. As discussed in more detail infra, the energy-receiving medium 18 receives light emitted from the light collector 12 via an optical communication path 20 (see FIG. 3) that exists between the light collector 12 and the energy-receiving medium 18.

The light collector 12 of the present invention is a solid sphere made from any translucent material(s). Being translucent, the material(s) transmit at least a portion of sunlight through the light collector 12. While some of the sunlight may be absorbed as it is transmitted through the translucent light collector 12, the light collector 12 is preferably made from transparent material(s) (e.g, glass, plastic, etc.), which allow a large portion of sunlight to be transmitted without absorption.

Figure 3:
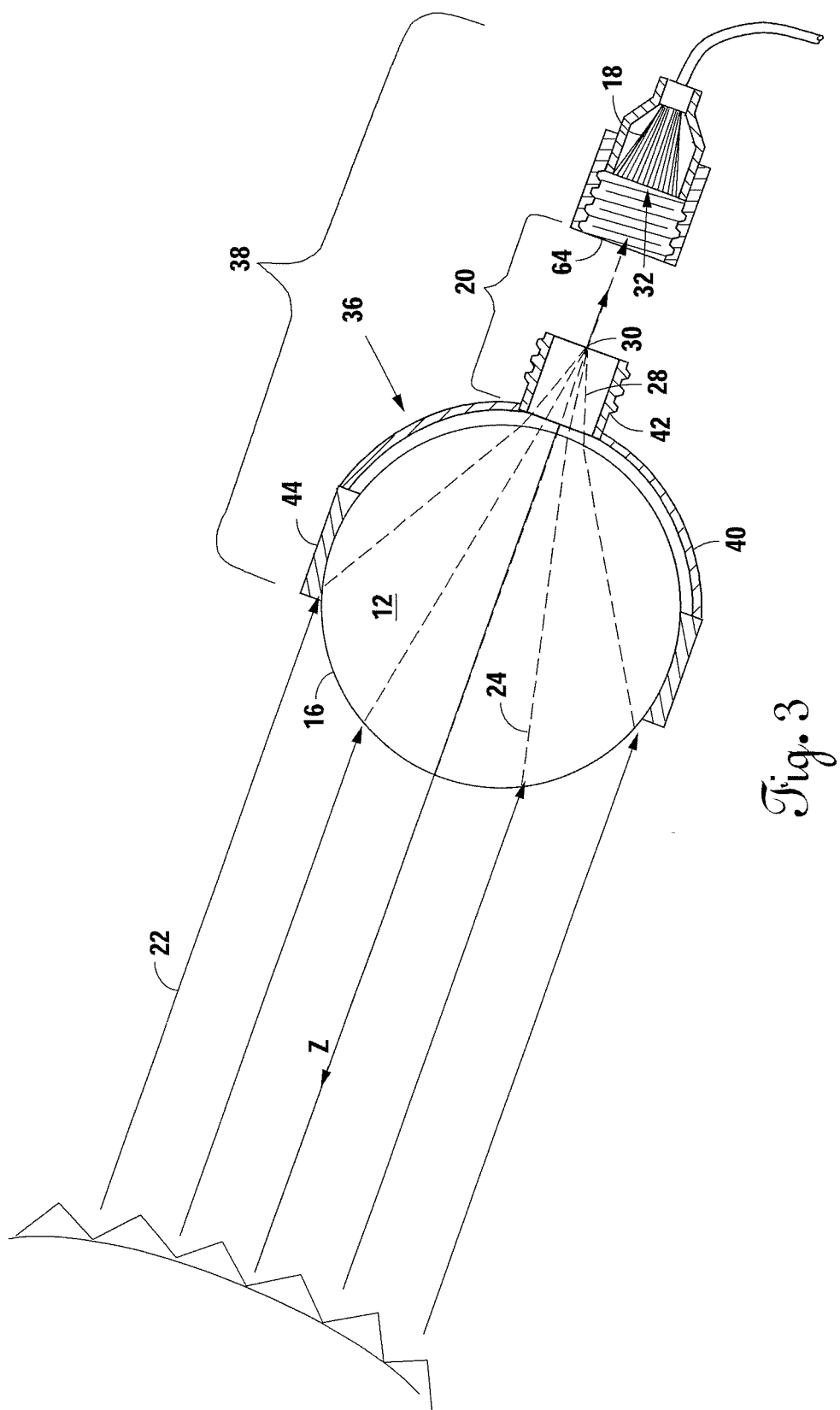
FIG. 3 is a cross section of the light collector of the present invention showing the path of sunlight transmitted through and emitted from the device.

FIG. 3 illustrates the path of sunlight as it travels from the sun, through the light collector 12, to the energy-receiving medium 18. Sunlight travels from the sun to the light collector 12 and encounters the sun-facing side 16 of the light collector 12. The sunlight which encounters the sun-facing side 16 of the light collector 12 is incident upon the light collector 12 and referred to as incident sunlight 22. The incident sunlight 22 enters into the light collector 12 through the sun-facing side 16. Once the incident sunlight 22 enters into the light collector 12 it becomes collected light 24 within the light collector 12.

The light collector 12 has a different index of refraction than the air surrounding the light collector 12 and as a result, the collected light 24 is refracted at the boundary between the light collector 12 and the air surrounding the sun-facing side 16. The preferred light collector 12 is made from a material or materials that will cause the collected light 24 to converge toward an optical axis z; however, in alternative embodiments the collected light 24 may be refracted away from the optical axis z, thereby diffusing the incident sunlight 22. As shown in FIG. 3, optical axis z is formed by extending a straight line from the sun, through the center point of the light collector 12, and out the side of the light collector 12 away from the sun-facing side 16.

The collected light 24 is transmitted through the light collector 12 and emerges from the light collector 12 as emitted light 28. The emitted light 28 travels away from the light collector 12 and, preferably, converges to a focal point 30. Focal point 30 is the location of the emitted light 28 where the intensity of the emitted light 28 is at its greatest. The location of the focal point 30 with respect to the light collector 12, known as the focal length, varies according to the diameter of the light collector 12, the material from which the light collector 12 is made, and irregularities in the shape of the light collector 12.

In its preferred embodiment, the light collector 12 has a four inch diameter and is made from glass containing 24% to 30% lead. As such, the focal point 30 is approximately ½ inches away from the closest point to the light collector 12. In alternative embodiments the focal point 30 may be closer to or further from the light collector 12 and may even be located on the circumference of the light collector 12—i.e., with no distance between the focal point 30 and the light collector 12.

As mentioned, the light collector 12 is a solid sphere. In its preferred embodiment, the light collector 12 is made from the same material throughout and has a uniform index of refraction throughout; however, the light collector 12 may be made from a variety of solid materials and the index of refraction may be varied throughout the light collector 12. Regardless of whether the light collector 12 is made from the same material throughout, the emitted light 28 should have enough intensity for useable energy to be received at the energy-receiving medium 18. In this regard, the material for the light collector 12 should be selected according to desired intensity of the emitted light 28 and the application of the invention, as discussed infra.

While the light collector 12 could be made from materials such as plastic, it is preferably made from glass. Glass resists fading and yellowing better than plastic but does not come at a significantly higher financial cost. As mentioned above, lead glass containing 24% to 30% lead is the preferred material for the light collector 12 mostly because it has a higher index of refraction than ordinary glass and increases the intensity of the emitted light 28 at its focal point 30. Lead glass is also easier to work with during manufacturing because it melts at lower temperatures than ordinary glass and the final product is more durable.

As shown in FIG. 3, the solar energy device 10 transmits emitted light 28 from the light collector 12 to a first end 32 of the energy-receiving medium 18 via the optical communication path 20. The first end 32 of the energy-receiving medium 18 is where the emitted light 28 first encounters the energy-receiving medium 18 and the optical communication path 20 is the optical pathway that the emitted light 28 takes from the light collector 12 to the first end 32 of the energy-receiving medium 18. The first end 32 should be oriented such that at least a portion of the emitted light 28 travels into the first end 32. Preferably, the optical axis z of the light collector 12 is substantially normal to the first end 32 of the energy-receiving medium 18 and the emitted light 28 enters into the first end 32 with minimal loss; however, in alternative embodiments the optical axis z may encounter the first end 32 at an angle.

The energy-receiving medium 18 is any medium that receives the energy contained within the emitted light 28 and absorbs energy contained in the emitted light 28. Preferably, the energy-receiving medium 18 transmits the absorbed energy to some sort of storage medium or elsewhere. As mentioned, when the present invention is directed to solar lighting the energy-receiving medium 18 is some sort of light-transmitting conduit, such as a bundle of optical fiber (i.e., fiber optics). Alternatively, the energy-receiving medium 18 could be a solar cell or a solar panel when the present invention is directed to the creation of electricity. The solar cell (or panel) creates electricity from the heat and/or light energy in the emitted light 28 through known processes and the electricity is then transmitted for direct use or stored for later use. In yet another example, the energy-receiving medium 18 may be some other type of heat sink (e.g., a heat exchanger) that absorbs heat from the emitted light 28 for transfer and heating elsewhere.

The optical communication path 20 may be formed from any medium (e.g., air, glass, vacuum, etc.) that is capable of transmitting the emitted light 28 to the first end 32 of the energy-receiving medium 18 so that the emitted light 28 arrives at the first end 32 with enough intensity to be used in accordance with the energy production needs of the solar energy device 10. For example, when the present invention is directed to solar lighting, the energy-receiving medium 18 is a light-transmitting conduit that transmits the emitted light 28 that enters into the first end 32 to another location. The optical communication path 20 should transmit the emitted light 28 to the first end 32 of the light-transmitting conduit with enough intensity for the emitted light 28 at the first end 32 to be transmitted through the light-transmitting conduit to illuminate another location.

Figure 4:
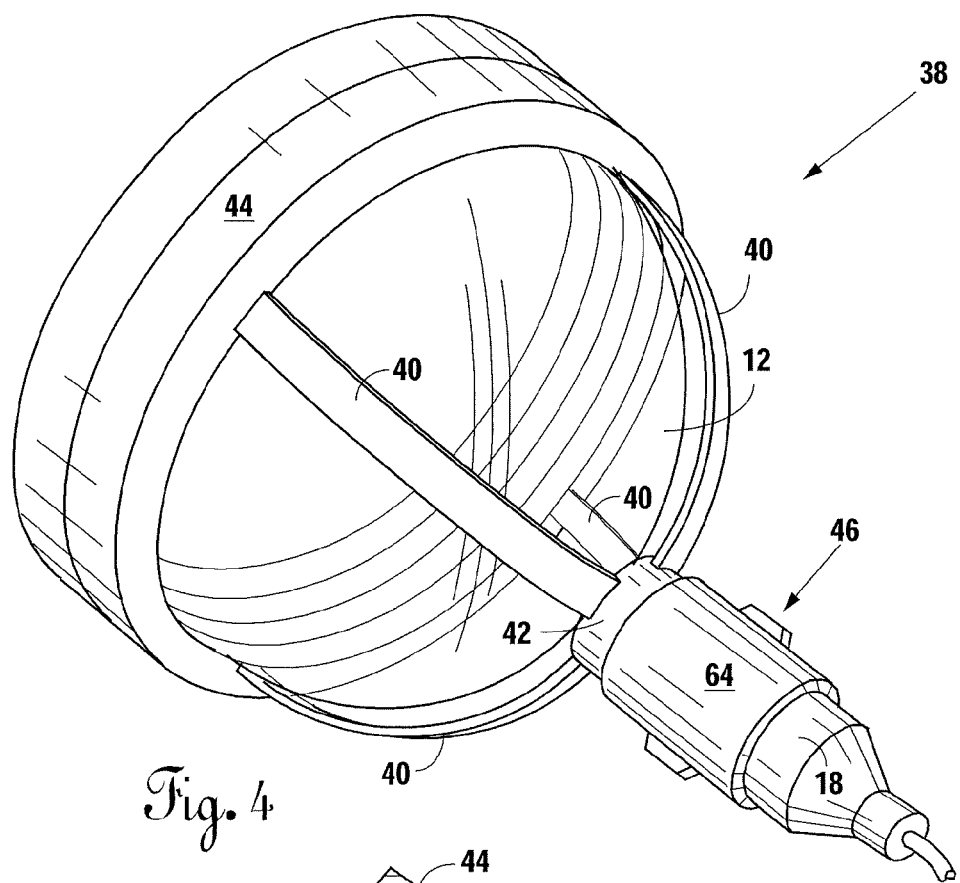
FIG. 4 is a perspective view of a light collector of the present invention mounted to the preferred bracket.

As shown in FIGS. 1 & 2, the preferred embodiment of the present invention has a plurality of light collectors 12 arranged into an array 34. Referring to FIGS. 2 & 4, each light collector 12 in the array 34 is coupled to a separate energy-receiving medium 18 with a bracket 36 such that the energy-receiving medium 18 and the light collector 12 are paired together. The bracket holds the light collector 12 in a position relative to the energy-receiving medium 18. The bracket 36, the light collector 12 contained by the bracket 36, and the energy-receiving medium 18 coupled to the light collector 12 by the bracket 36, together, form a light-collecting module 38 (see FIGS. 6 & 7).

The preferred bracket 36 for each light-collecting module 38 is shown in FIGS. 4-7. The bracket 36 has four legs 40 extending between a base piece 42 and a circumferential piece 44. The circumferential piece 44 extends around the circumference of the spherical light collector 12 and holds the light collector 12 statically in place. Each of the four legs 40 are attached to the base piece 42 and the circumferential piece 44. As such, the legs 40 hold the light collector 12 in a position relative to the base piece 42. The base piece 42 connects either directly or indirectly to the first end 32 of the energy-receiving medium 18 and holds the first end 32 in position relative to the light collector 12. The optical communication path 20 extends from light collector 12, through the base piece 42, and to the first end 32 of the energy-receiving medium 18.

In the preferred embodiment, the first end 32 of the energy-receiving medium 18 is precisely located at the focal point 30 of the emitted light 28. An adjustment mechanism 46 is located at the base piece 42 to the first end 32. The adjustment mechanism 46 alters the distance between the first end 32 and the base piece 38, which allows the first end 32 to be focused on the focal point 30. The preferred adjustment mechanism is a threaded sleeve 64 that threads onto the base piece 42. The threaded sleeve 64 is turned to increase or decrease the distance between the base piece 42 and the first end 32.

It should be noted that alternative adjustments mechanisms other than that shown can be used. For example, the first end 32 of the energy-receiving medium 18 may be statically connected to the base piece 42 with the adjustment mechanism 46 being located in the legs 40, so the base piece 42 moves relative to the light collector 12.

It should also be noted that the bracket 36 can be shaped differently than the preferred bracket 36 shown. The bracket 36 is any device which couples an individual light collector 12 to the first end 12 of an energy-receiving medium 18. An alternative bracket 36 may have more or less legs 40 and/or the circumferential piece 44 may not extend around the entire circumference of the light collector 12. As another example, the bracket 36 could also be shaped generally as a square, so the legs 40 each have a right angle, or, the bracket 36 may have an entirely different form altogether.

It should be further noted that the light collectors within the preferred array 34 illustrated in FIGS. 1 & 2 are shown as being arranged in a planar array 34; however, the light collectors within the array 34 could be arranged differently (e.g., in an arced shape). In addition, each light collector 12 in the array 34 may not have a separate energy-receiving medium 18 coupled to it such as in the preferred embodiment with the preferred bracket 36. For example, the array 34 may be arced and emit light into a centrally located energy-receiving medium 18 positioned under the arc. Moreover, the number of light collectors within the array 34 can also vary, depending on the energy needs and application of the present invention.

Figure 5:
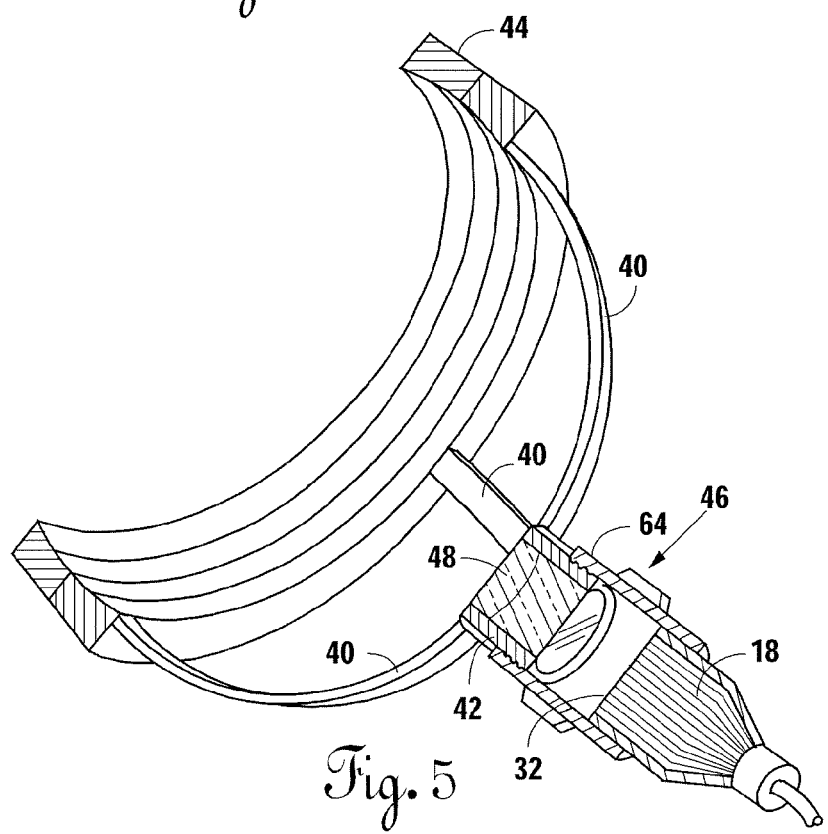
FIG. 5 is a cross-sectional side view of the light collector and preferred bracket shown in FIG. 4.

A spectrum filter 48 is present in some embodiments of the present invention (see FIG. 5). The spectrum filter 48 reduces certain wavelengths of light so that the emitted light 28 is filtered by the time it encounters the first end 32 of the energy-receiving medium 18. Which wavelength of light gets filtered and whether the spectrum filter 48 is even present depends on the application of the invention. For example, the spectrum filter 48 reduces ultraviolet light and infrared light when the present invention is directed to solar lighting because (1) ultraviolet light is harmful to humans and fades color and (2) infrared light produces heat that could damage the first end 32 of the light-transmitting conduit. In contrast, when the present invention is directed to heating applications, the spectrum filter 48 would not reduce the infrared light because heat energy is desirable and the infrared light produces the heat absorbed into the energy-receiving medium 18.

Figure 6:
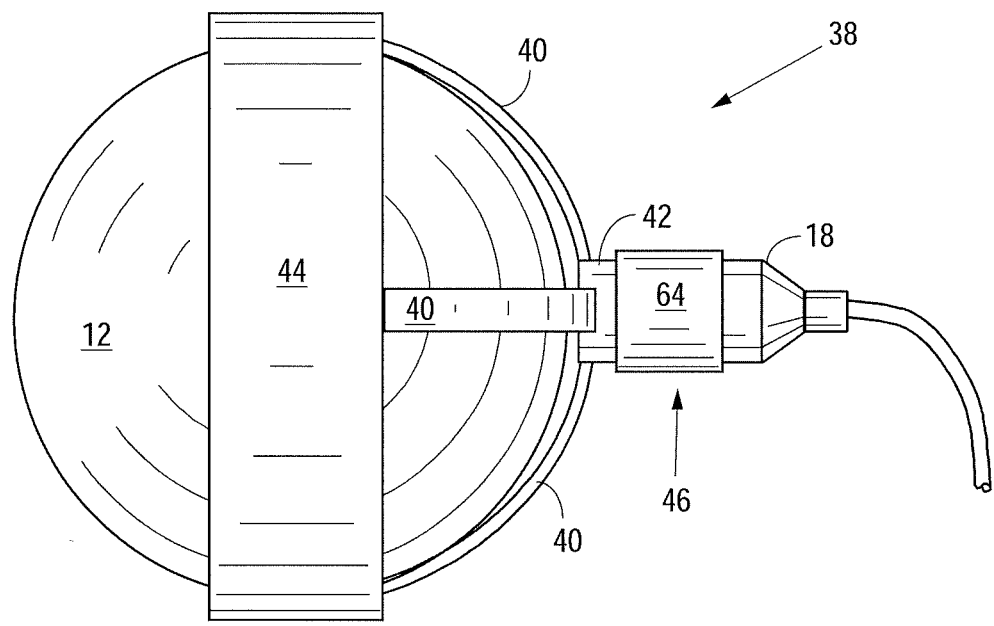
FIG. 6 is a side view of the preferred light collector and bracket shown in FIG. 4, with an energy-receiving medium attached to and extending from the bracket.
Figure 7:
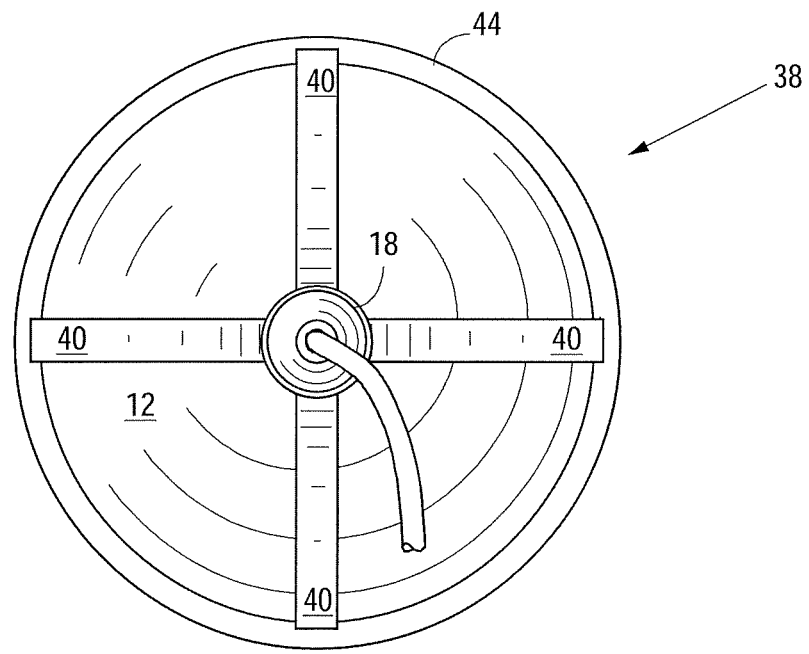
FIG. 7 is a side view of the spherical light collector and bracket shown in FIG. 4, with an energy-receiving medium connected to and extending from the bracket.

When present, the spectrum filter 48 can be located in a variety of places on the solar energy device 10. As shown in FIGS. 5 & 6, the spectrum filter 48 is in the optical communication path 20 (i.e., in the base piece 42) and the emitted light 28 travels from the light collector 12 through the spectrum filter 48, to the first end 32 of the energy-receiving device 18. In alternative embodiments, the spectrum filter 48 may be located on the surface of the light collector 12 such that the incident sunlight 22 is filtered as it enters into the light collector 12. In other embodiments the spectrum filter 48 may be incorporated into the material from which the light collector 12 is made such that the collected light 24 is filtered as it is transmitted through the light collector 12 and the emitted light 28 is already filtered when it emerges from the light collector 12.

In the preferred embodiment, the solar energy device 10 can be repositioned throughout the day so the array 34 constantly faces the sun. The stand 14 has a base 50 with arms 52 extending therefrom (see FIGS. 1 & 2) and the arms 52 are pivotally mounted to the base 50 so they can rotate about an axis y. The arms 52 diverge away from each other as they extend away from the base 50 and each eventually terminates at a terminal end 54. The array 34 is positioned between the arms 52 and pivotally mounted to the arms 52 at their terminal end 54, allowing the array 34 to rotate about an axis x that is transverse to axis y.

The presence of dual axes of rotation in the preferred embodiment allows the solar energy device 10 to be repositioned in response to the sun's path across the sky. Although the solar device 10 may be repositioned manually, the repositioning preferably is achieved through an automated tracking system (not shown). In the preferred embodiment the tracking system is an active system that drives electric motors (not shown); however, the tracking system may be a passive system that uses compressed gas fluid that drives pistons when heated. When an active system is present, it tracks the sun's path by using photosensors that measure the intensity of the incident sunlight 22, electronic logic based on mathematical formulas which model the sun's path, or a combination of both. A processor (not shown) processes the information from the photosensors and/or the electronic logic and actuates the motors accordingly.

Referring to FIGS. 1-2, the motor which causes the arms 52 to rotate about they axis is located in a housing 56, where the arms 52 pivotally mount to the base 50. The motor which causes the array 34 to rotate about the x axis is located in a housing 58 where the array 34 pivotally mounts to the arms 52. These electric motors and the processor are preferably powered via photovoltaic solar energy powered by the incident sunlight 22. As shown in FIG. 1, the solar energy device 10 has a solar panel 60 in the center of the array 34. The solar panel 60 has solar cells that generate electricity through known processes (e.g., the photovoltaic process) and the generated electricity powers the motors and the processor.

The arms 52 are curved in the preferred stand 14 shown in FIGS. 1 & 2. The curvature of the arms 52 helps prevent the numerous energy-receiving mediums from becoming tangled as the solar energy device 10 rotates about they axis while it follows the path of the sun. Moreover, it is envisioned that a number of solar energy devices 10 may be mounted to a structure such as an office building or a house. As such, the base 50 of the preferred stand 14 has mounting screws 62 (see FIGS. 1 & 2) to anchor the solar energy device 10 to the structure. The mounting screws 62 hold the solar energy device 10 securely in place so the device remains upright, even against high winds. Alternatively, the solar energy device 10 could be mounted using other types of fasteners, weights, or any other means to anchor the device to the structure on which it resides.

Although the present invention has been described with reference to specific embodiments, this description is not meant to be construed in a limiting sense. Various modifications of the disclosed embodiments, as well as alternative embodiments of the invention will become apparent to persons skilled in the art upon the reference to the above description of the invention. It is, therefore, contemplated that the appended claims will cover such modifications that fall within the scope of the invention.

I claim:

1. A solar energy device comprising:
a stand having a base with a first arm and a second arm mounted to said base;
at least one light collecting module mounted to said stand between said first and second arms, said light collecting module comprising:
a substantially spherical light collector solidly formed of a translucent material;
at least one energy-receiving medium having a first end facing said light collector;
a bracket having a circumferential piece around the light collector and a base piece connected to the energy-receiving medium, said bracket having at least one leg extending between said circumferential piece and said base piece; and,
an optical communication path between said light collector and said first end of said energy-receiving medium.

2. The solar lighting device of claim 1 wherein said at least one light collecting module is a plurality of light collecting modules configured into an array, said array being pivotally mounted between the first and second arms of the stand.

3. The solar lighting device of claim 2 wherein said energy-receiving medium is a plurality of energy-receiving mediums.

4. The solar lighting device of claim 1 comprising a spectrum filter, said spectrum filter being configured to reduce certain wavelengths of light from said light collector.

5. The solar lighting device of claim 4 wherein said spectrum filter is positioned in said optical communication path.

6. The solar lighting device of claim 1 wherein said translucent material is a transparent material.

7. The solar lighting device of claim 6 wherein said transparent material is glass.

8. The solar lighting device of claim 7 wherein said transparent material is lead glass.

9. The solar lighting device of claim 1 wherein said at least one energy-receiving medium is a light-transmitting conduit.

10. The solar lighting device of claim 9 wherein said light-transmitting conduit is a bundle of optical fibers.

11. A solar energy device comprising:
a stand having a base with a first arm and a second arm mounted to said base;
at least one bracket mounted to said stand between said first and second arms, said bracket having a circumferential piece;
at least one substantially spherical, solidly formed, translucent light collector within the circumferential piece of the bracket; and,
at least one energy-receiving medium having a first end optically communicated with said at least one light collector, said first end being located at a distance from said at least one light collector and facing said light collector.

12. The solar energy device of claim 11 wherein said at least one light collector comprises a plurality of light collectors.

13. The solar energy device of claim 12 wherein each of said light collectors has at least one energy-receiving medium coupled thereto.

14. The solar energy device of claim 11 wherein said light collector has a focal point and said first end of said energy-receiving medium is located near the focal point.

15. A solar energy device comprising:
a stand;
at least one bracket mounted to said stand, said bracket having a circumferential piece, a base piece, and at least one leg extending between said base piece and said circumferential piece;
at least one light collector within the circumferential piece of the bracket, said at least one light collector being a solid, substantially spherical object formed of a translucent material, and having a focal point; and,
at least one energy-receiving medium having a first end connected to the base piece of the bracket, said first end being optically communicated with said at least one light collector and being located substantially at the focal point.

16. The solar energy device of claim 15 wherein said at least one bracket is a plurality of brackets and wherein each of said brackets is coupled to a separate energy-receiving medium.

17. The solar energy device of claim 15 wherein said translucent material is a transparent material.

18. The solar energy device of claim 17 wherein said transparent material is glass.

19. The solar energy device of claim 18 wherein said transparent material is lead glass.

* * * * *